(12) United States Patent
Yan et al.

(10) Patent No.: US 11,183,257 B1
(45) Date of Patent: Nov. 23, 2021

(54) PROGRAMMABLE MEMORY

(71) Applicant: Shanghai Huali Microelectronics Corporation, Shanghai (CN)

(72) Inventors: Ying Yan, Shanghai (CN); Jianming Jin, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 16/952,262

(22) Filed: Nov. 19, 2020

(30) Foreign Application Priority Data

Aug. 18, 2020 (CN) .......................... 202010831329.8

(51) Int. Cl.
*G11C 17/16* (2006.01)
*H01L 23/525* (2006.01)
*H01L 27/112* (2006.01)

(52) U.S. Cl.
CPC ........ *G11C 17/165* (2013.01); *H01L 23/5252* (2013.01); *H01L 27/11206* (2013.01)

(58) Field of Classification Search
CPC .................................................. G11C 17/165
USPC ......................................................... 365/96
See application file for complete search history.

(56) References Cited

U.S. PATENT DOCUMENTS

| | | | | |
|---|---|---|---|---|
| 2011/0317468 | A1* | 12/2011 | Terzioglu | G11C 17/16 365/96 |
| 2014/0146620 | A1* | 5/2014 | Park | G11C 7/08 365/189.09 |
| 2017/0040067 | A1* | 2/2017 | Byun | G11C 29/027 |
| 2017/0092682 | A1* | 3/2017 | Choi | H04N 5/378 |

* cited by examiner

*Primary Examiner* — Muna A Techane
(74) *Attorney, Agent, or Firm* — Banner & Witcott, Ltd.

(57) ABSTRACT

The present application discloses a programmable memory, wherein an anti-fuse unit thereof is formed by adding an efuse between an anti-fuse programming transistor and a control transistor of a conventional anti-fuse unit such that the anti-fuse unit can be programmed twice, that is, normal programming can be implemented by breaking down a gate-source insulation layer of the anti-fuse programming transistor, and correction programming can be further implemented by fusing the efuse such that correction programming can be performed on a normal programming result, thereby changing a logical state of the normally programmed anti-fuse unit. For the programmable memory, a reprogramming method can be directly used to correct an error bit, thereby simplifying circuit and layout designs, resulting in a smaller layout area and higher reliability, increasing the applicability and flexibility, while retaining original features of reliable and safe data of the anti-fuse unit.

8 Claims, 5 Drawing Sheets

PROGRAMMABLE MEMORY

CROSS-REFERENCES TO RELATED APPLICATIONS

This application claims priority to Chinese Patent Application No. 202010831329.8, filed on Aug. 18, 2020, and entitled "Programmable Memory", the disclosure of which is incorporated herein by reference in its entirety.

TECHNICAL FIELD

The present application relates to integrated circuit design technologies, in particular to a programmable memory of which a programming result thereof can undergo a correction operation once.

BACKGROUND

The anti-fuse and efuse both are one time programmable (OTP) memory structures.

Both of the two programmable memory structures adopt a standard CMOS technology and have a small unit area, lowering the total cost and resulting in good security.

The anti-fuse breaks down an insulation layer between a polysilicon layer and an N+ diffusion layer of a programming transistor to change (decrease) the resistance value between the two layers, resulting in a change in an equivalent logical value and achieving programming of "1" to "0". The anti-fuse programmable memory can be programmed only once, i.e., "1"→"0", limiting the application scope and flexibility thereof.

The efuse realizes chip programming by fusing the fuse and changing the resistance at both ends of the fuse according to the characteristics of electron migration. Similarly, the programming can be performed only once, greatly limiting the user field use condition and product production and test capability and resulting in poor redundancy performance.

The conventional anti-fuse unit is shown in FIG. 1. A redundant bit is usually used to correct the programming result of a one time programmable memory which adopts the conventional anti-fuse unit, that is, a redundant bit is added in addition to the normal bits. After the redundant bit is programmed, the address information and actual value of an error bit are recorded in a redundant area. If an input bit address is exactly the address where an error occurs, the system ignores the stored error value and reads out the corresponding correct value. Using redundant bits to correct the programming results will result in complex circuit and layout design, which will increase the layout area and lead to low reliability.

BRIEF SUMMARY

The technical problem solved by the present application is providing a programmable memory, wherein a reprogramming method can be directly used to correct an error bit of an anti-fuse unit thereof, thereby simplifying circuit and layout designs, resulting in a smaller layout area and higher reliability, increasing the applicability and flexibility, while retaining original features of reliable and safe data of the anti-fuse unit.

In order to solve the above technical problem, the programmable memory provided by the present application comprises at least one anti-fuse unit, wherein the anti-fuse unit comprises an anti-fuse programming transistor M0, an efuse EF, and a first control transistor MN1;

a source of the anti-fuse programming transistor M0 is connected to one end of the efuse EF and serves as a VQ end of the anti-fuse unit;

a gate of the anti-fuse programming transistor M0 serves as a read sense end S of the anti-fuse unit; and the other end of the efuse EF is connected to a drain of the first control transistor MN1.

In an example, the first control transistor MN1 is an NMOS transistor; and a source of the first control transistor MN1 is connected to the ground GND, and a gate thereof is connected to a first bit line BLC1.

In an example, the anti-fuse unit further comprises a first PMOS selective transistor MP1, a second PMOS selective transistor MP2, and a second control transistor MN2;

a source of the first PMOS selective transistor MP1 is connected to a breakdown working voltage VPPH, a gate thereof is connected to the first bit line BLC1, and a drain thereof is connected to the gate of the anti-fuse programming transistor M0;

the first PMOS selective transistor MP1 is used to provide the anti-fuse unit with the breakdown working voltage VPPH required by normal programming;

a drain of the second PMOS selective transistor MP2 is connected to the VQ end of the anti-fuse unit, a source thereof is connected to a fusing voltage VDDQ, and a gate thereof is connected to a second bit line BLC2;

the second PMOS selective transistor MP2 is used to provide the anti-fuse unit with the fusing voltage VPPH required by a correction programming operation;

the second control transistor MN2 is an NMOS transistor, having a drain connected to the VQ end of the anti-fuse unit, a gate connected to a third bit line BLC3, and a source connected to the ground GND; and a gate of the first control transistor MN1 is connected to the first bit line BLC1.

In an example, the anti-fuse unit is in an initial state before programmed; and when the anti-fuse unit is in the initial state, a high resistance state is present between the gate and the source of the anti-fuse programming transistor M0, the efuse EF has a low resistance, since the anti-fuse programming transistor and the efuse are connected in series, before programming, a high resistance state is present between the read sense end (S) of the entire anti-fuse unit and the ground GND, and a logical state is defined as "1".

In an example, during a normal programming operation performed on the anti-fuse unit, the breakdown working voltage VPPH is applied to the source of the first PMOS selective transistor MP1, the breakdown working voltage VPPH is greater than a gate-source insulation layer breakdown voltage of the first PMOS selective transistor MP1, and the source of the second PMOS selective transistor MP2 is connected to a 0 voltage; the first bit line BLC1 is at a high level such that the first PMOS selective transistor MP1 is conductive and the first control transistor MN1 is non-conductive, the second bit line BLC2 is at a low level such that the second PMOS selective transistor MP2 is non-conductive, and the third bit line BLC3 is at a low level such that the second control transistor MN2 is conductive;

during the normal programming operation performed on the anti-fuse unit, a voltage between the gate and the source of the anti-fuse programming transistor M0 reaches the breakdown working voltage VPPH, and a gate-source insulation layer of the anti-fuse programming transistor M0 is broken down, such that a gate-source resistance of the anti-fuse programming transistor M0 sharply decreases to 1

KΩ-20 KΩ and a current flows from the read sense end S through the anti-fuse programming transistor M0 and the second control transistor MN2 to the ground GND, in which case there is no current passing through the efuse EF and a resistance status of the efuse EF remains unchanged; and after the normal programming is performed on the anti-fuse unit, a low resistance state is present between the read sense end S and the ground GND, and the entire anti-fuse unit is programmed into a logical state "0".

In an example, during a correction programming operation performed on the normally programmed anti-fuse unit, the source of the first PMOS selective transistor MP1 is connected to a 0 voltage, the source of the second PMOS selective transistor MP2 is connected to the fusing voltage VDDQ, the first bit line BLC1 is at a low level such that the first PMOS selective transistor MP1 is non-conductive and the first control transistor MN1 is conductive, the second bit line BLC2 is at a high level such that the second PMOS selective transistor MP2 is conductive, and the third bit line BLC3 is at a high level such that the second control transistor MN2 is non-conductive; and the fusing voltage VDDQ causes a programming current to flow through the efuse EF, resulting in an electromigration, which causes the efuse EF to fuse and increase the resistance, such that a high resistance state is present between the read sense end S and the ground GND after the entire anti-fuse unit undergoes the correction programming operation, that is, the entire anti-fuse unit is reprogrammed into a logical state "1".

In an example, the read sense end S of the anti-fuse unit is connected to a sense amplification module SA; and during a read operation performed on the anti-fuse unit, the sense amplification module SA converts an equivalent resistance value between the read sense end S and the ground GND into a logical value output.

In an example, during the read operation performed on the anti-fuse unit, the first PMOS selective transistor MP1 and the second PMOS selective transistor MP2 are non-conductive, the first control transistor MN1 is conductive, and the second control transistor MN2 is non-conductive; and a read current flows through the sense amplification module SA, the anti-fuse programming transistor M0, the efuse EF, and the first control transistor MN1 to the ground GND.

In an example, during the read operation performed on the anti-fuse unit, the first bit line BLC1 is at a high level such that the first PMOS selective transistor MP1 is non-conductive and the first control transistor MN1 is conductive, the second bit line BLC2 is at a high level such that the second PMOS selective transistor MP2 is non-conductive, and the third bit line BLC3 is at a 0 voltage such that the second control transistor MN2 is non-conductive.

In the programmable memory provided by the present application, an anti-fuse programming transistor M0, an efuse EF, and a control transistor are connected in series to form an anti-fuse unit, the efuse is added between the anti-fuse programming transistor and the control transistor of a conventional anti-fuse unit such that the anti-fuse unit can be programmed twice, that is, normal programming can be implemented by breaking down a gate-source insulation layer of the anti-fuse programming transistor (decreasing a large resistance), and correction programming can be further implemented by fusing the efuse (increasing the resistance), such that correction programming can be performed on a normal programming result (from a logical value 1 to a logical value 0), thereby changing a logical state of the normally programmed anti-fuse unit. That is, after a normal programming operation is performed on the anti-fuse unit, a user can correct the normal programming result once (correcting a logical value 0 into a logical value 1). For the programmable memory, a reprogramming method can be directly used to correct an error bit, thereby simplifying circuit and layout designs, resulting in a smaller layout area and higher reliability, increasing the applicability and flexibility, while retaining original features of reliable and safe data of the anti-fuse unit.

BRIEF DESCRIPTION OF THE DRAWINGS

In order to more clearly describe the technical solution of the present application, the drawings required in the present application will be briefly described below. It is obvious that the drawings described below are merely some embodiments of the present application, and those skilled in the art could also obtain other drawings on the basis of these drawings without contributing any inventive labor.

DETAILED DESCRIPTION OF THE DISCLOSURE

The technical solution of the present application will be clearly and completely described below with reference to the drawings. Obviously, the described embodiments are part of the embodiments of the present application, instead of all of them. Based on the embodiments in the present application, all other embodiments obtained by those skilled in the art without contributing any inventive labor shall fall into the protection scope of the present application.

Embodiment 1

A programmable memory includes at least one anti-fuse unit.

Figure 1:
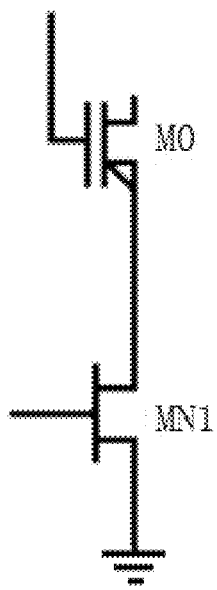
FIG. 1 is a circuit diagram of a conventional anti-fuse unit.
Figure 2:
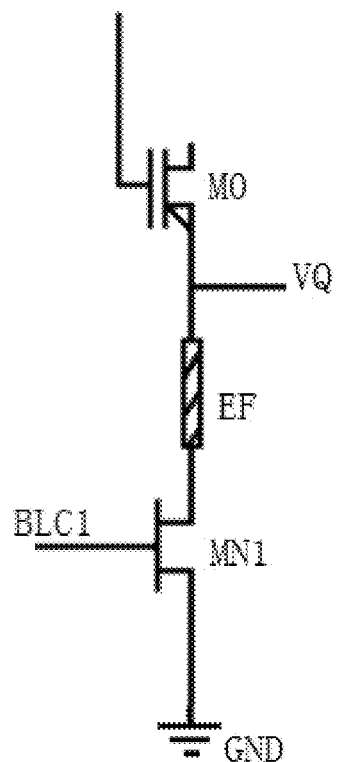
FIG. 2 is a circuit diagram of an anti-fuse unit of a programmable memory according to an embodiment of the present application.

Referring to FIG. 2, the anti-fuse unit includes an anti-fuse programming transistor M0, an efuse EF, and a first control transistor MN1.

A source of the anti-fuse programming transistor M0 is connected to one end of the efuse EF and serves as a VQ end of the anti-fuse unit.

A gate of the anti-fuse programming transistor M0 serves as a read sense end S of the anti-fuse unit.

The other end of the efuse EF is connected to a drain of the first control transistor MN1.

In an example, the first control transistor MN1 is an NMOS transistor.

A source of the first control transistor MN1 is connected to the ground GND, and a gate thereof is connected to a first bit line BLC1.

In the programmable memory of embodiment 1, an anti-fuse programming transistor M0, an efuse EF, and a control transistor are connected in series to form an anti-fuse unit, the efuse is added between the anti-fuse programming transistor and the control transistor of a conventional anti-fuse unit such that the anti-fuse unit can be programmed twice, that is, normal programming can be implemented by breaking down a gate-source insulation layer of the anti-fuse programming transistor (decreasing a large resistance), and correction programming can be further implemented by fusing the efuse (increasing the resistance), such that correction programming can be performed on a normal programming result (from a logical value 1 to a logical value 0), thereby changing a logical state of the normally programmed anti-fuse unit. That is, after a normal programming operation is performed on the anti-fuse unit, a user can correct the normal programming result once (correcting a logical value 0 into a logical value 1). For the programmable memory, a reprogramming method can be directly used to correct an error bit, thereby simplifying circuit and layout designs, resulting in a smaller layout area and higher reliability, increasing the applicability and flexibility, while retaining original features of reliable and safe data of the anti-fuse unit.

Embodiment 2

Figure 3:
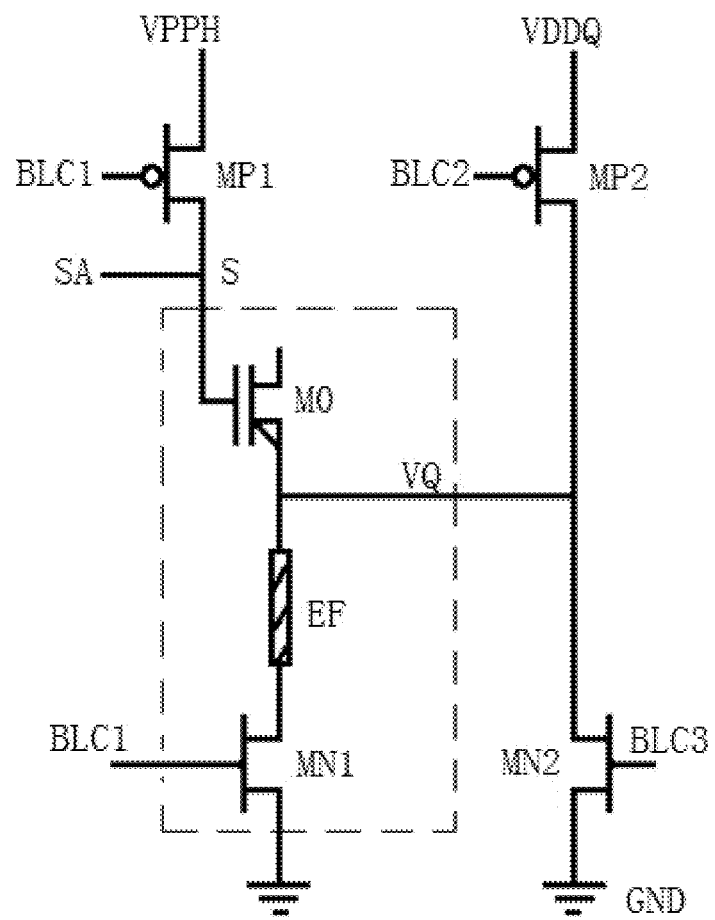
FIG. 3 is a basic application circuit of the anti-fuse unit of the programmable memory according to an embodiment of the present application.

On the basis of the programmable memory of embodiment 1, referring to FIG. 3, the anti-fuse unit further includes a first PMOS selective transistor MP1, a second PMOS selective transistor MP2, and a second control transistor MN2.

A source of the first PMOS selective transistor MP1 is connected to a breakdown working voltage VPPH, a gate thereof is connected to the first bit line BLC1, and a drain thereof is connected to the gate of the anti-fuse programming transistor M0.

The first PMOS selective transistor MP1 is used to provide the anti-fuse unit with the breakdown working voltage VPPH required by normal programming.

A drain of the second PMOS selective transistor MP2 is connected to the VQ end of the anti-fuse unit, a source thereof is connected to a fusing voltage VDDQ, and a gate thereof is connected to a second bit line BLC2.

The second PMOS selective transistor MP2 is used to provide the anti-fuse unit with the fusing voltage VPPH required by a correction programming operation.

The second control transistor MN2 is an NMOS transistor, having a drain connected to the VQ end of the anti-fuse unit, a gate connected to a third bit line BLC3, and a source connected to the ground GND.

A gate of the first control transistor MN1 is connected to the first bit line BLC1.

Embodiment 3

On the basis of the programmable memory of embodiment 2, the anti-fuse unit is in an initial state (pre) before programmed.

Referring to FIG. 3, when the anti-fuse unit is in the initial state (pre-programming), a high resistance state is present between the gate and the source of the anti-fuse programming transistor M0, the efuse EF has a low resistance, since the anti-fuse programming transistor and the efuse are connected in series, before programming, a high resistance state is present between the read sense end (S) of the entire anti-fuse unit and the ground GND, and a logical state is defined as "1".

Figure 4:
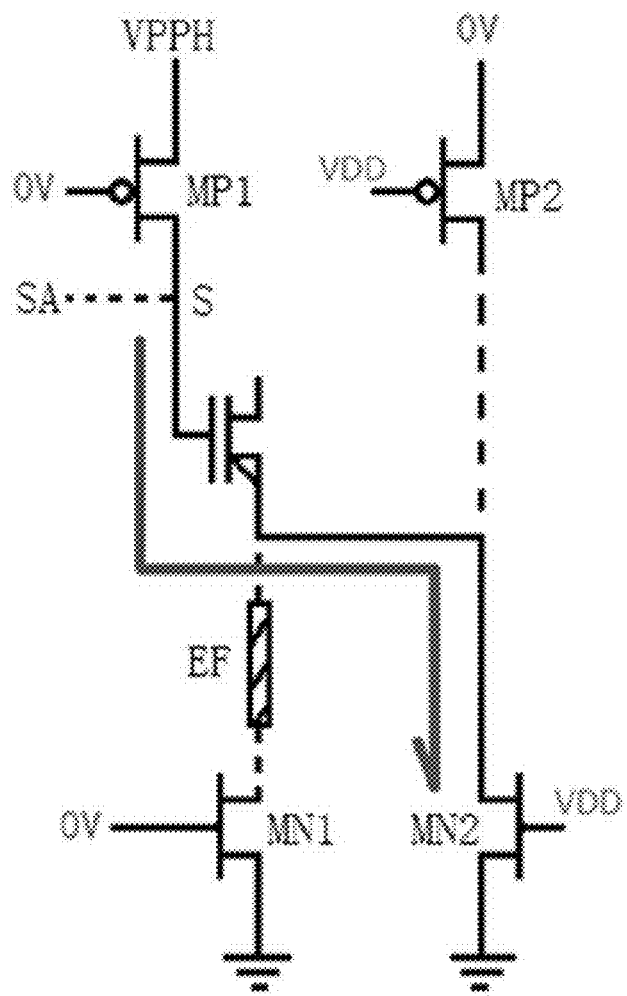
FIG. 4 is a schematic diagram of a normal programming state of the anti-fuse unit of the programmable memory according to an embodiment of the present application.

Referring to FIG. 4 (the dashed line represents an open circuit), during a normal programming operation performed on the anti-fuse unit, the breakdown working voltage VPPH is applied to the source of the first PMOS selective transistor MP1, the breakdown working voltage VPPH is greater than a gate-source insulation layer breakdown voltage of the first PMOS selective transistor MP1, and the source of the second PMOS selective transistor MP2 is connected to a 0 voltage; the first bit line BLC1 is at a high level such that the first PMOS selective transistor MP1 is conductive and the first control transistor MN1 is non-conductive, the second bit line BLC2 is at a low level such that the second PMOS selective transistor MP2 is non-conductive, and the third bit line BLC3 is at a low level such that the second control transistor MN2 is conductive.

During the normal programming operation performed on the anti-fuse unit, a voltage between the gate and the source of the anti-fuse programming transistor M0 reaches the breakdown working voltage VPPH, and a gate-source insulation layer of the anti-fuse programming transistor M0 is broken down, such that a gate-source resistance of the anti-fuse programming transistor M0 sharply decreases to 1 KΩ-20 KΩ and a current flows from the read sense end S through the anti-fuse programming transistor M0 and the second control transistor MN2 to the ground GND, in which case there is no current passing through the efuse EF and a resistance status of the efuse EF remains unchanged.

After the normal programming is performed on the anti-fuse unit, a low resistance state is present between the read sense end S and the ground GND, and the entire anti-fuse unit is programmed into a logical state "0".

Figure 5:
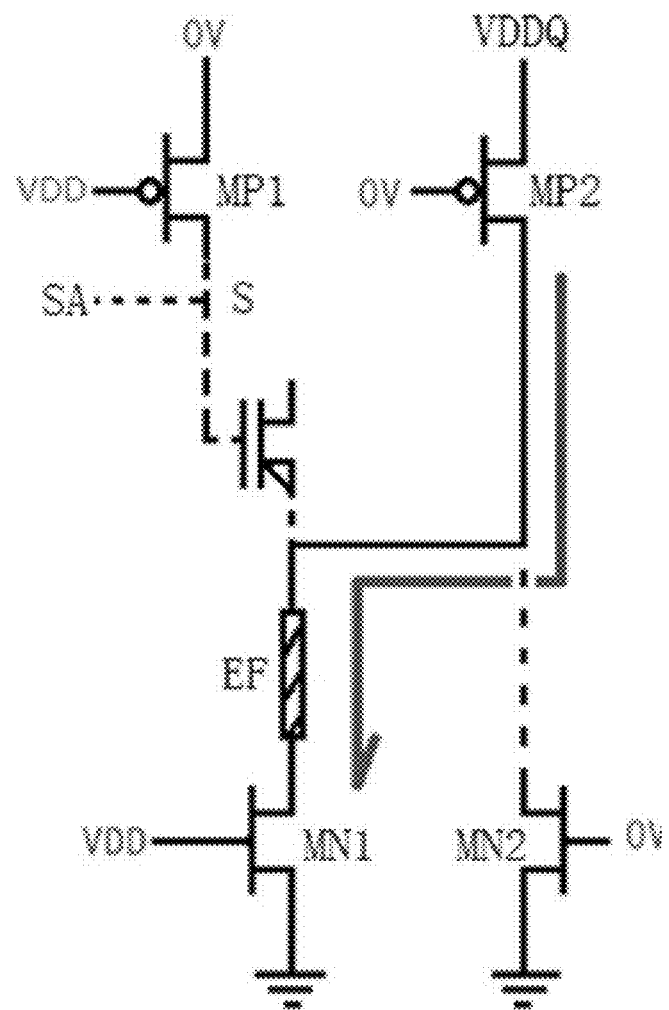
FIG. 5 is a schematic diagram of a correction programming state of the anti-fuse unit of the programmable memory according to an embodiment of the present application.

Referring to FIG. 5 (the dashed line represents an open circuit), during a correction programming operation performed on the normally programmed anti-fuse unit, the source of the first PMOS selective transistor MP1 is connected to a 0 voltage, the source of the second PMOS selective transistor MP2 is connected to the fusing voltage VDDQ, the first bit line BLC1 is at a low level such that the first PMOS selective transistor MP1 is non-conductive and the first control transistor MN1 is conductive, the second bit line BLC2 is at a high level such that the second PMOS selective transistor MP2 is conductive, and the third bit line BLC3 is at a high level such that the second control transistor MN2 is non-conductive; and the fusing voltage VDDQ causes a programming current to flow through the efuse EF, resulting in an electromigration, which causes the efuse EF to fuse and increase the resistance, such that a high resistance state is present between the read sense end S and the ground GND after the entire anti-fuse unit undergoes the correction programming operation, that is, the entire anti-fuse unit is reprogrammed into a logical state "1".

For the programmable memory of embodiment 3, a reprogramming method can be directly used to correct an error bit, thereby simplifying circuit and layout designs of the programmable memory, resulting in a smaller layout area and higher reliability.

Embodiment 4

On the basis of the programmable memory of embodiment 3, the read sense end S of the anti-fuse unit is connected to a sense amplification module SA.

During a read operation performed on the anti-fuse unit, the sense amplification module SA converts an equivalent resistance value between the read sense end S and the ground GND into a logical value output.

In an example, during the read operation performed on the anti-fuse unit, the first PMOS selective transistor MP1 and the second PMOS selective transistor MP2 are non-conductive, the first control transistor MN1 is conductive, and the second control transistor MN2 is non-conductive.

A read current flows through the sense amplification module SA, the anti-fuse programming transistor M0, the efuse EF, and the first control transistor MN1 to the ground GND.

Figure 6:
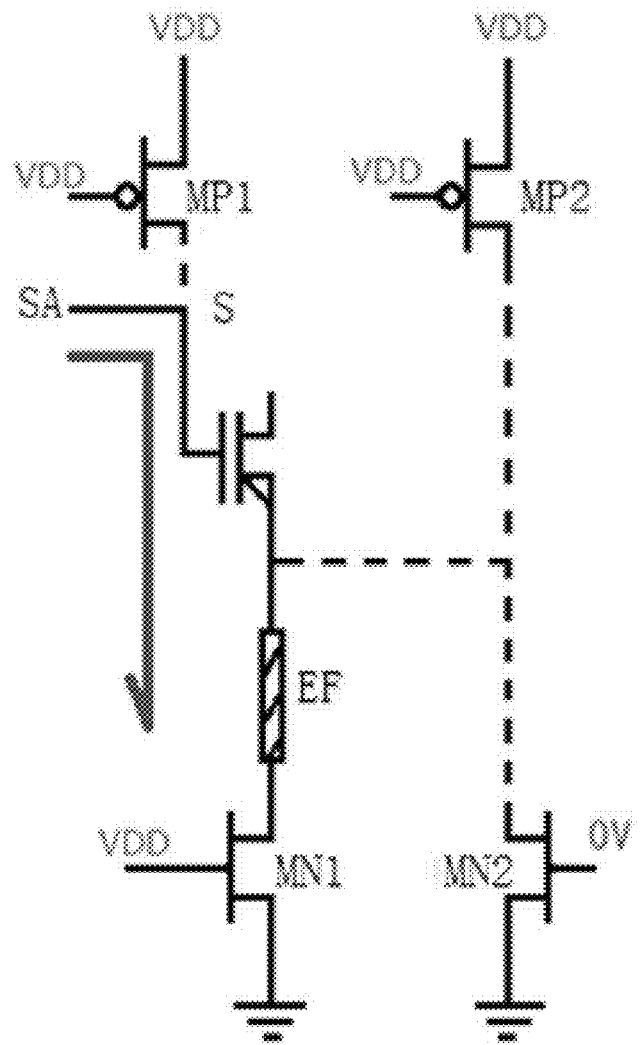
FIG. 6 is a schematic diagram of a read state of the anti-fuse unit of the programmable memory according to an embodiment of the present application.

In an example, referring to FIG. 6 (the dashed line represents an open circuit), during the read operation performed on the anti-fuse unit, the first bit line BLC1 is at a high level such that the first PMOS selective transistor MP1 is non-conductive and the first control transistor MN1 is conductive, the second bit line BLC2 is at a high level such that the second PMOS selective transistor MP2 is non-conductive, and the third bit line BLC3 is at a 0 voltage such that the second control transistor MN2 is non-conductive.

The above embodiments are merely preferred embodiments of the present application and are not intended for limiting the present application. Any changes, equivalent replacements, or improvements made within the spirit and principle of the present application shall fall within the protection scope of the present application.

What is claimed is:

1. A programmable memory, comprising at least one anti-fuse unit, wherein the anti-fuse unit comprises an anti-fuse programming transistor (M0), an efuse (EF), and a first control transistor (MN1);
    a source of the anti-fuse programming transistor (M0) is connected to one end of the efuse (EF) and serves as a voltage qualification (VQ) end of the anti-fuse unit;
    a gate of the anti-fuse programming transistor (M0) serves as a read sense end (S) of the anti-fuse unit;
    the other end of the efuse (EF) is connected to a drain of the first control transistor (MN1);
    wherein the anti-fuse unit further comprises a first PMOS selective transistor (MP1), a second PMOS selective transistor (MP2), and a second control transistor (MN2);
    a source of the first PMOS selective transistor (MP1) is connected to a breakdown working voltage (VPPH), a gate thereof is connected to a first bit line (BLC1), and a drain thereof is connected to the gate of the anti-fuse programming transistor (M0);
    the first PMOS selective transistor (MP1) is used to provide the anti-fuse unit with the breakdown working voltage (VPPH) required by normal programming;
    a drain of the second PMOS selective transistor (MP2) is connected to the VQ end of the anti-fuse unit, a source thereof is connected to a fusing voltage (VDDQ), and a gate thereof is connected to a second bit line (BLC2);
    the second PMOS selective transistor (MP2) is used to provide the anti-fuse unit with the fusing voltage (VPPH) required by a correction programming operation;
    the second control transistor (MN2) is an NMOS transistor, having a drain connected to the VQ end of the anti-fuse unit, a gate connected to a third bit line (BLC3), and a source connected to a ground (GND); and
    a gate of the first control transistor (MN1) is connected to the first bit line (BLC1).

2. The programmable memory according to claim 1, wherein
    the first control transistor (MN1) is an NMOS transistor; and
    a source of the first control transistor (MN1) is connected to the ground (GND).

3. The programmable memory according to claim 1, wherein
    the anti-fuse unit is in an initial state before being programmed; and
    when the anti-fuse unit is in the initial state, a high resistance state is present between the gate and the source of the anti-fuse programming transistor (M0), the efuse (EF) has a low resistance, and, since the anti-fuse programming transistor and the efuse are connected in series, before programming, a high resistance state is present between the read sense end (S) of the anti-fuse unit and the ground (GND), and the anti-fuse unit is in a logical state "1".

4. The programmable memory according to claim 3, wherein
    during a normal programming operation performed on the anti-fuse unit, the breakdown working voltage (VPPH) is applied to the source of the first PMOS selective transistor (MP1), the breakdown working voltage (VPPH) is greater than a gate-source insulation layer breakdown voltage of the first PMOS selective transistor (MP1), and the source of the second PMOS selective transistor (MP2) is connected to a 0 voltage; the first bit line (BLC1) is at a high level such that the first PMOS selective transistor (MP1) is conductive and the first control transistor (MN1) is non-conductive, the second bit line (BLC2) is at a low level such that the second PMOS selective transistor (MP2) is non-conductive, and the third bit line (BLC3) is at a low level such that the second control transistor (MN2) is conductive;
    during the normal programming operation performed on the anti-fuse unit, a voltage between the gate and the source of the anti-fuse programming transistor (M0) reaches the breakdown working voltage (VPPH), and a gate-source insulation layer of the anti-fuse programming transistor (M0) is broken down, such that a gate-source resistance of the anti-fuse programming transistor (M0) sharply decreases to 1 KΩ-20 KΩ and a current flows from the read sense end (S) through the anti-fuse programming transistor (M0) and the second control transistor (MN2) to the ground (GND), in which case there is no current passing through the efuse (EF) and a resistance status of the efuse (EF) remains unchanged; and
    after the normal programming operation is performed on the anti-fuse unit, a low resistance state is present between the read sense end (S) and the ground (GND), and the anti-fuse unit is programmed into a logical state "0".

5. The programmable memory according to claim 4, wherein
    during a correction programming operation performed on a normally programmed anti-fuse unit, the source of the first PMOS selective transistor (MP1) is connected to a 0 voltage, the source of the second PMOS selective transistor (MP2) is connected to the fusing voltage (VDDQ), the first bit line (BLC1) is at a low level such that the first PMOS selective transistor (MP1) is non-conductive and the first control transistor (MN1) is conductive, the second bit line (BLC2) is at a high level such that the second PMOS selective transistor (MP2) is conductive, and the third bit line (BLC3) is at a high level such that the second control transistor (MN2) is non-conductive; and the fusing voltage (VDDQ) causes a programming current to flow through the efuse (EF), resulting in an electromigration, which causes the efuse (EF) to fuse and increase the resistance, such that a high resistance state is present between the read sense end S and the ground (GND) after the anti-fuse unit undergoes the correction programming operation, that is, the anti-fuse unit is reprogrammed into the logical state "1".

6. The programmable memory according to claim 1, wherein
the read sense end (S) of the anti-fuse unit is connected to a sense amplification module (SA); and
during a read operation performed on the anti-fuse unit, the sense amplification module (SA) converts an equivalent resistance value between the read sense end (S) and the ground (GND) into a logical value output.

7. The programmable memory according to claim 6, wherein
during the read operation performed on the anti-fuse unit, the first PMOS selective transistor (MP1) and the second PMOS selective transistor (MP2) are non-conductive, the first control transistor (MN1) is conductive, and the second control transistor (MN2) is non-conductive; and
a read current flows through the sense amplification module (SA), the anti-fuse programming transistor (M0), the efuse (EF), and the first control transistor (MN1) to the ground (GND).

8. The programmable memory according to claim 7, wherein
during the read operation performed on the anti-fuse unit, the first bit line (BLC1) is at a high level such that the first PMOS selective transistor (MP1) is non-conductive and the first control transistor (MN1) is conductive, the second bit line (BLC2) is at a high level such that the second PMOS selective transistor (MP2) is non-conductive, and the third bit line (BLC3) is at a 0 voltage such that the second control transistor (MN2) is non-conductive.

* * * * *